US008824344B2

(12) United States Patent
Watanabe

(10) Patent No.: US 8,824,344 B2
(45) Date of Patent: Sep. 2, 2014

(54) TIME DIVISION DUPLEX COMMUNICATION APPARATUS AND RECEPTION INTERFERENCE PREVENTING METHOD THEREOF

(75) Inventor: Junji Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 106 days.

(21) Appl. No.: 13/392,984

(22) PCT Filed: Aug. 26, 2010

(86) PCT No.: PCT/JP2010/005251

§ 371 (c)(1), (2), (4) Date: Feb. 28, 2012

(87) PCT Pub. No.: WO2011/030512

PCT Pub. Date: Mar. 17, 2011

(65) Prior Publication Data

US 2012/0170493 A1 Jul. 5, 2012

(30) Foreign Application Priority Data

Sep. 9, 2009 (JP) ................................ 2009-207606

(51) Int. Cl.

| | |
|---|---|
| ***H04L 5/14*** | (2006.01) |
| ***H04L 25/08*** | (2006.01) |
| ***H04B 1/52*** | (2006.01) |
| ***H03G 3/30*** | (2006.01) |
| ***H04B 1/10*** | (2006.01) |
| *H04B 17/00* | (2006.01) |

(52) U.S. Cl.

CPC ............ *H04B 1/525* (2013.01); *H04B 17/0057* (2013.01); *H03G 3/3052* (2013.01); *H04B 17/0052* (2013.01); *H04B 17/0042* (2013.01); *H04B 1/109* (2013.01)

USPC .......................................... 370/294; 375/346

(58) Field of Classification Search

None

See application file for complete search history.

(56) References Cited

U.S. PATENT DOCUMENTS 5,751,766 A * 5/1998 Kletsky et al. ................ 375/224
5,896,424 A 4/1999 Uchida et al.

(Continued)

FOREIGN PATENT DOCUMENTS

CN 1333945 1/2002
CN 101277480 10/2008

(Continued)

OTHER PUBLICATIONS

International Search Report, PCT/JP2010/005251, Nov. 22, 2010.

(Continued)

*Primary Examiner* — Ian N Moore
*Assistant Examiner* — Eric P Smith
(74) *Attorney, Agent, or Firm* — Young & Thompson

(57) ABSTRACT

Provided is a time division duplex communication apparatus capable of distinguishing interruption by a received interference wave at a reception time, interruption occurring upon completion of measurement of received power, and interruption caused by power leaked into a receiving system during transmission time. The time division duplex communication apparatus includes a variable attenuator 7 for adjusting power of a reception signal, an interruption factor detection unit 11 for detecting an interruption signal from the reception signal, a reception timing determination unit 21 for determining whether the interruption signal is due to a received interference wave, and an interference wave determination unit 31 for controlling the variable attenuator 7 when it is determined that the interruption signal is due to the received interference wave.

16 Claims, 10 Drawing Sheets

(56) References Cited

U.S. PATENT DOCUMENTS

| | | | | |
|---|---|---|---|---|
| 6,408,168 | B1 * | 6/2002 | Sessink | 455/250.1 |
| 6,563,891 | B1 * | 5/2003 | Eriksson et al. | 375/345 |
| 6,804,501 | B1 * | 10/2004 | Bradley et al. | 455/138 |
| 6,894,982 | B1 | 5/2005 | Shimizu | |
| 7,545,733 | B2 | 6/2009 | Blasco Claret et al. | |
| 8,249,540 | B1 * | 8/2012 | Gupta et al. | 455/296 |
| 2002/0183027 | A1 * | 12/2002 | Husted et al. | 455/219 |
| 2004/0120249 | A1 | 6/2004 | Blasco Claret et al. | |
| 2007/0082629 | A1 * | 4/2007 | Shimizu et al. | 455/127.2 |
| 2007/0275680 | A1 * | 11/2007 | Kaiki et al. | 455/184.1 |
| 2010/0329321 | A1 * | 12/2010 | Avellone et al. | 375/227 |

FOREIGN PATENT DOCUMENTS

| | | |
|---|---|---|
| JP | 8-088582 | 4/1996 |
| JP | 9-261086 | 10/1997 |
| JP | 11-112442 | 4/1999 |
| JP | 2004-529577 | 9/2004 |
| JP | 2008-136109 | 6/2008 |

OTHER PUBLICATIONS

CN Office Action dated Oct. 22, 2013, with English Translation; Application No. 201080039310.4.

* cited by examiner

TIME DIVISION DUPLEX COMMUNICATION APPARATUS AND RECEPTION INTERFERENCE PREVENTING METHOD THEREOF

TECHNICAL FIELD

The present invention relates to a time division duplex communication apparatus and a reception interference preventing method thereof, and more specifically, to a time division duplex communication apparatus and a reception interference preventing method thereof for preventing an analog/digital converter from overflowing due to a received interference wave.

BACKGROUND ART

A time division duplex transmitting/receiving apparatus that includes a receiver, a transmitter, and a switch for switching the receiver and the transmitter by time division duplex is known. FIG. 9 is a configuration diagram of one example of a time division duplex transmitting/receiving apparatus related to the present invention. Referring to FIG. 9, one example of the time division duplex transmitting/receiving apparatus related to the present invention includes a receiver 201, a transmitter 202, and a switch 203.

Further, the receiver 201 includes a low noise amplifier (hereinafter referred to as an LNA) 305, a down converter 306, a variable attenuator 307, a digital down converter (hereinafter referred to as a DDC) module 308, an FPGA 312, and a CPU (Central Processing Unit) 313.

Further, the DDC module 308 includes an A/D (Analog to Digital) converter 309, a DDC unit 310, and an interruption factor register 311. Further, the FPGA 312 includes a buffer 23.

Further, the transmitter 202 includes a power amplifier (hereinafter referred to as a PA) 303, an up-converter 302, and a D/A (Digital to Analog) converter 301.

In this time division duplex transmitting/receiving apparatus, the FPGA 312 receives an interruption signal from the interruption factor register 311 in the DDC module 308, and transmits the interruption signal to the CPU 313. Receiving the interruption signal, the CPU 313 controls the variable attenuator 307 based on the interruption signal to adjust gain.

FIG. 10 is a timing chart showing one example of operations in a time division duplex transmitting/receiving apparatus related to the present invention. FIG. 10 shows a case in which interruption by a received interference wave at the reception time (see FIG. 10(D)), interruption upon completion of measurement of the received power at the reception time (see FIG. 10(B)), and interruption by electric power leaked into a receiving system at the transmission time (see FIG. 10(C)) are detected in the interruption factor register 311. In this case, an interference wave determination window 59 is set so that determination is made for the whole time period.

However, the CPU 313 desires to detect only interruption (see FIG. 10(D)) by the received interference wave at the reception time. This is because the CPU 313 controls the variable attenuator 307 based on the interruption by the received interference wave at the reception time to adjust gain. On the other hand, in this case, interruption (see FIG. 10(B)) upon completion of measurement of received power at the reception time and interruption (see FIG. 10(C)) by electric power leaked into the receiving system at the transmission time are also detected in the CPU 313, which results in false detection.

Further, a radio terminal apparatus for decreasing clock frequencies of a CPU to prevent occurrence of reception noise when received electric field strength is low is known as an example of the related art of the present invention (see e.g., patent literature 1).

The radio terminal apparatus controls clock frequencies in response to the reception slot start interruption, and restores the clock frequencies in response to the reception slot end interruption. The radio terminal apparatus controls the clock frequencies according to the intensity of the reception level.

Further, the invention related to automatic gain control in a communication system using orthogonal frequency division multiplex or time division duplex is disclosed as another example of a related art of the present invention (see e.g., patent literature 2).

This is based on the control of an aspect such as the number of overflows (saturations in the ADC receiver) produced during a predetermined time window and equalization weights. This results in that gain in the receiver is reduced when the number of overflows in the time window is greater than a predetermined threshold value.

CITATION LIST

Patent Literature

PTL 1: Japanese Unexamined Patent Application Publication No. 11-112442

PTL 2: Published Japanese Translation of PCT International Publication for Patent Application, No. 2004-529577

SUMMARY OF INVENTION

Technical Problem

When the overflow bit indicating that the A/D converter has overflowed is used to address with a received interference wave in a time division duplex (TDD) apparatus related to the present invention, the electric power leaked into the receiving system at the transmission time operates the overflow bit of the A/D converter, which may disturb detection of the overflow bit by the received interference wave that is desired to be detected.

Since transmission and reception are constantly switched, the transmission/reception switch timing is sent when a ready-made digital down converter (DDC) device is used. In a DDC device, this external timing is used only when the measurement of the received power is performed for the sake of simplification, and the input power overflow interruption may always occur regardless of the transmission/reception time period.

Accordingly, it is impossible to determine whether the overflow bit detection is the transmission time or the reception time. One advantage of the time division duplex communication is that the transmission and the reception need not be sufficiently isolated since the transmission and the reception are temporally separated. However, this advantage cannot be used effectively. Even when excessive input by the interference wave is to be detected based on the measurement result of the received power, it is impossible to detect the excessive input since the power measurement is performed by data that is overflowed as long as the A/D converter which is provided at the previous stage of the power measurement unit overflows.

Further, a ready-made DDC device uses only one kind of interruption notification to the outside of the device in order to simplify an interface. The DDC device is required to check the state of a register inside the device to determine the detail of the interruption factor. The interruption of the reception time is notified not only when the overflow is detected but also when the received power measurement is completed. Therefore, the method of detecting only the "interruption of reception time" does not sufficient for the DDC device to determine the content until when the interruption factor is checked. Since the DDC device is not able to issue the next interruption unless the DDC device checks the interruption factor to clear the register, it is impossible to capture the interruption that is desired to be detected.

In summary, the time division duplex apparatus related to the present invention is not capable of distinguishing (1) interruption by a received interference wave at the reception time, (2) interruption upon completion of measurement of the received power at the reception time, or (3) interruption by the electric power leaked into the receiving system at the transmission time.

While the invention disclosed in the patent literature 1 is similar to the present invention in that it performs control in response to interruption, it is not targeted to distinguish the interruptions. Accordingly, the invention disclosed in the patent literature 1 cannot solve the above problems.

Further, while the invention disclosed in the patent literature 2 is similar to the present invention in that it controls gain of the receiver according to the information within the time window, the information in the time window is the number of overflows and is totally different from the information indicating the timing of occurrence of the received interference wave according to the present invention. Accordingly, the invention disclosed in the patent literature 2 also cannot solve the problems described above.

An advantageous object of the present invention is to provide a time division duplex communication apparatus and a reception interference preventing method thereof that are capable of distinguishing interruption by a received interference wave at the reception time, interruption upon completion of measurement of the received power at the reception time, and interruption by electric power leaked into the receiving system at the transmission time, and thus are capable of preventing overflow of the A/D converter by gain adjustment with respect to the received interference wave.

Solution to Problem

In order to solve the problems, a time division duplex communication apparatus according to the present invention includes: adjustment means for adjusting power of a reception signal; interruption detection means for detecting an interruption signal from the reception signal; determination means for determining whether the interruption signal is due to a received interference wave; and control means for controlling the adjustment means when it is determined that the interruption signal is due to the received interference wave.

Further, a reception interference preventing method according to the present invention includes: adjusting power of a reception signal; detecting an interruption signal from the reception signal; determining whether the interruption signal is due to a received interference wave; and controlling power adjustment of the reception signal when it is determined that the interruption signal is the received interference wave.

Further, a non-transitory computer readable medium storing a program according to the present invention causes a computer to execute the following steps of: adjusting power of a reception signal; detecting interruption for detecting an interruption signal from the reception signal; determining whether the interruption signal is due to a received interference wave; and controlling the adjustment means when it is determined that the interruption signal is due to the received interference wave.

Advantageous Effects of Invention

According to the present invention, it is possible to distinguish interruption by a received interference wave at the reception time, interruption upon completion of measurement of the received power at the reception time, and interruption by electric power leaked into the receiving system at the transmission time, thereby capable of preventing overflow of the A/D converter by gain adjustment with respect to the received interference wave.

DESCRIPTION OF EMBODIMENTS

Figure 1:
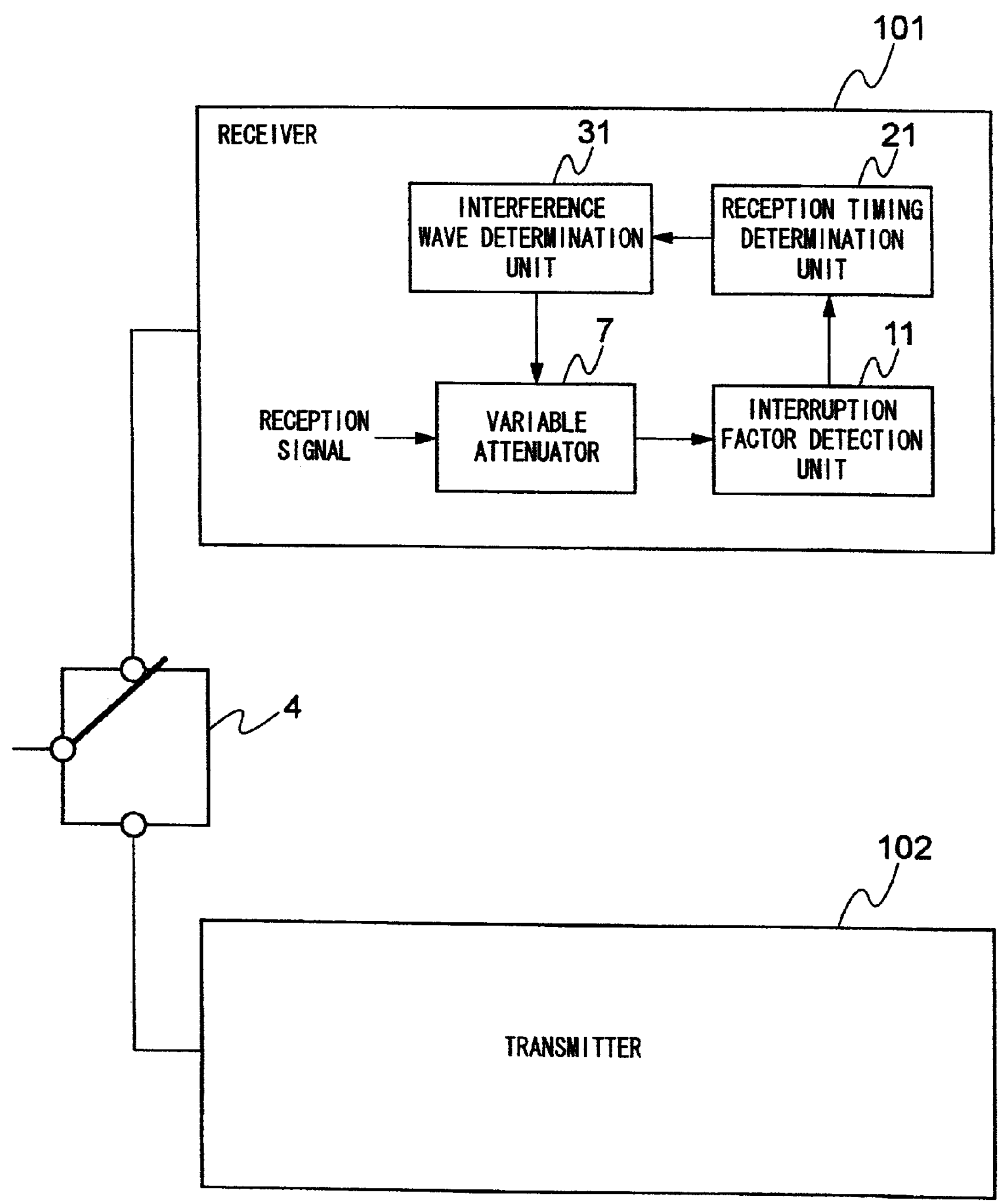
FIG. 1 is a configuration diagram for describing an operation principle of a time division duplex communication apparatus according to the present invention.

First, before explaining exemplary embodiments, an operational principle of the present invention will be described. FIG. 1 is a configuration diagram for describing the operational principle of a time division duplex transmitting/receiving apparatus according to the present invention. Referring to FIG. 1, the time division duplex communication apparatus according to the present invention includes a receiver 101, a transmitter 102, and a switch 4 for switching the receiver 101 and the transmitter 102 by time division duplex.

Further, the receiver 101 includes a variable attenuator 7 for adjusting gain of a reception signal, an interruption factor detection unit 11 for detecting occurrence of interruption based on an output signal from the variable attenuator 7, a reception timing determination unit 21 for receiving notification of occurrence of interruption from the interruption factor detection unit 11 and determining whether the interruption is due to a received interference wave using a temporal window for determining the received interference wave, and an interference wave determination unit 31 for controlling the variable attenuator 7 when it is determined by the reception timing determination unit 21 that the interruption is due to the received interference wave. Note that adjusting the gain of the reception signal by the variable attenuator 7 means adjusting power (electric power) of the reception signal input to the interruption factor detection unit 11.

Next, an operation of the time division duplex communication apparatus will be described. The reception timing determination unit 21 includes a temporal window for detecting only the interruption by the received interference wave. Accordingly, false detection of interruption upon completion of measurement of the received power or interruption due to electric power leaked into the receiving system at the transmission time can be prevented, thereby making it possible to perform gain adjustment with respect to the received interference wave.

Next, features of the present invention will be described. One of the features of the present invention is a function as follows. That is, in a receiver of time division duplex system, when there is only one kind of interruption notification although there are a plurality of interruption factors input from a digital down converter (DDC) for an FPGA (Field Programmable Gate Array) that performs timing management, a temporal window is arranged in the FPGA that receives the interruption to distinguish the interruption to be processed.

When there is only one kind of signal that notifies occurrence of interruption although there are a plurality of interruption factors, instead of arranging a window to simply distinguish the reception time from the transmission time, a window is provided in a time slot 1 that satisfies the two conditions: "time during which the reception signal definitely exists" and "time during which received power measurement interruption cannot occur" to prevent false recognition of interruptions of other reception relations including received power measurement.

Accordingly, it is possible to prevent false detection of overflow of a transmission time period due to the insufficient isolation between transmission and reception and to definitely capture only the interference wave that is input concurrently with the received desired wave to prevent overflow by gain adjustment with respect to the received interference wave. As a result, a dynamic range of an artificial A/D converter can be enlarged by gain adjustment with respect to the high-level interference wave, thereby making it possible to achieve an inexpensive system using an A/D converter of low bit number.

Figure 2:
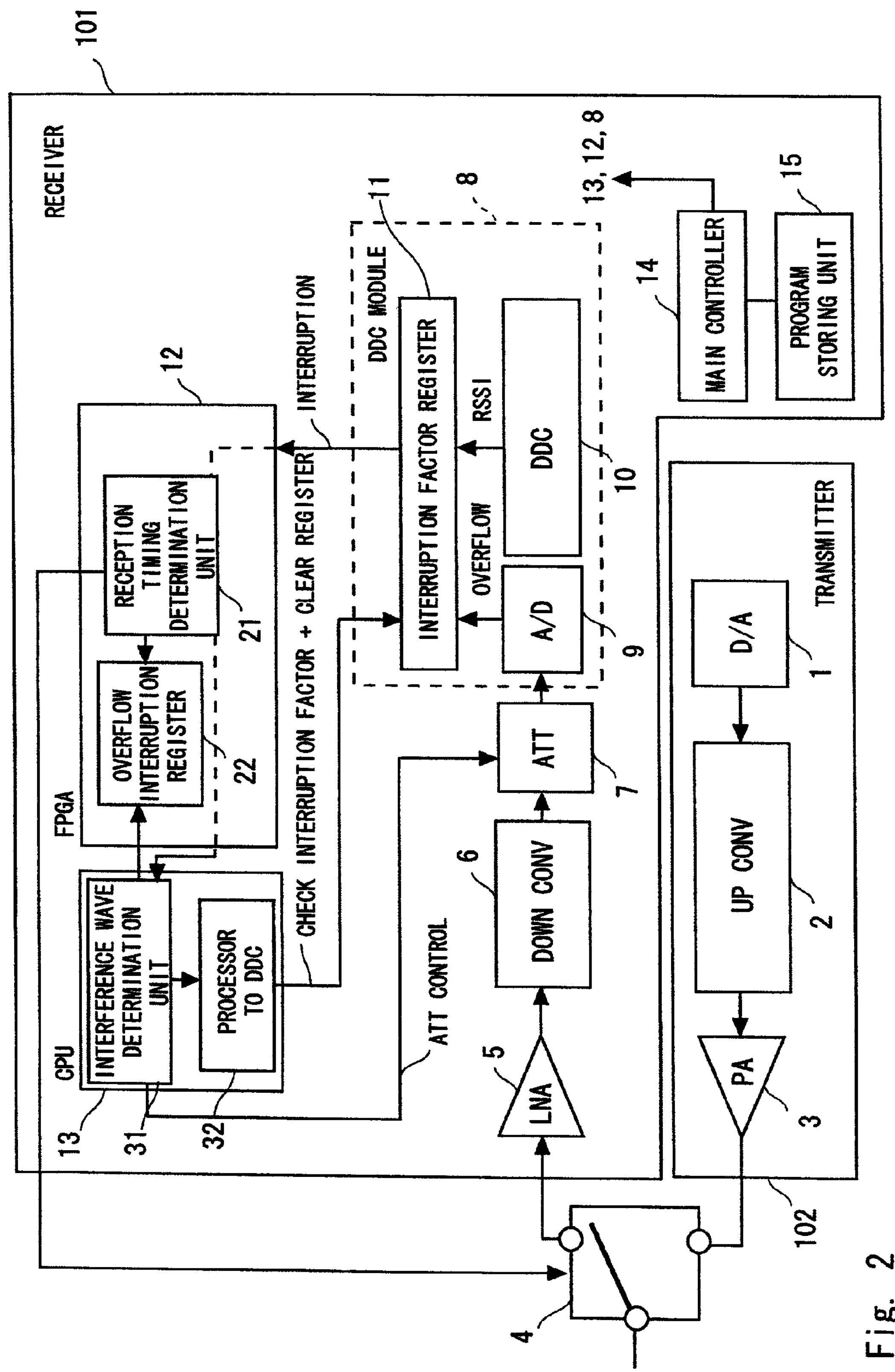
FIG. 2 is a configuration diagram in a first exemplary embodiment of the time division duplex communication apparatus according to the present invention.

Hereinafter, with reference to the accompanying drawings, exemplary embodiments of the present invention will be described. First, a first exemplary embodiment will be described. FIG. 2 is a configuration diagram in the first exemplary embodiment of the time division duplex communication apparatus according to the present invention. In FIG. 2, one example of the time division duplex communication apparatus according to the present invention includes a receiver 101, a transmitter 102, and a switch 4.

Further, the receiver 101 includes a low noise amplifier (hereinafter referred to as an LNA) 5, a down converter 6, a variable attenuator 7, a digital down converter (hereinafter referred to as a DDC) module 8, an FPGA 12, a CPU 13, a main controller 14, and a program storing unit 15.

Further, the DDC module 8 includes an A/D converter 9, a DDC unit 10, and an interruption factor register 11. Further, the FPGA 12 includes an overflow interruption register 22 and a reception timing determination unit 21. Furthermore, the CPU 13 includes an interference wave determination unit 31, and a processor 32 to DDC.

Further, the transmitter 102 includes a power amplifier (hereinafter referred to as a PA) 3, an up-converter 2, and a digital to analog (D/A) converter 1. The configurations and operations of the main controller 14 and the program storing unit 15 will be described later.

Figure 3:
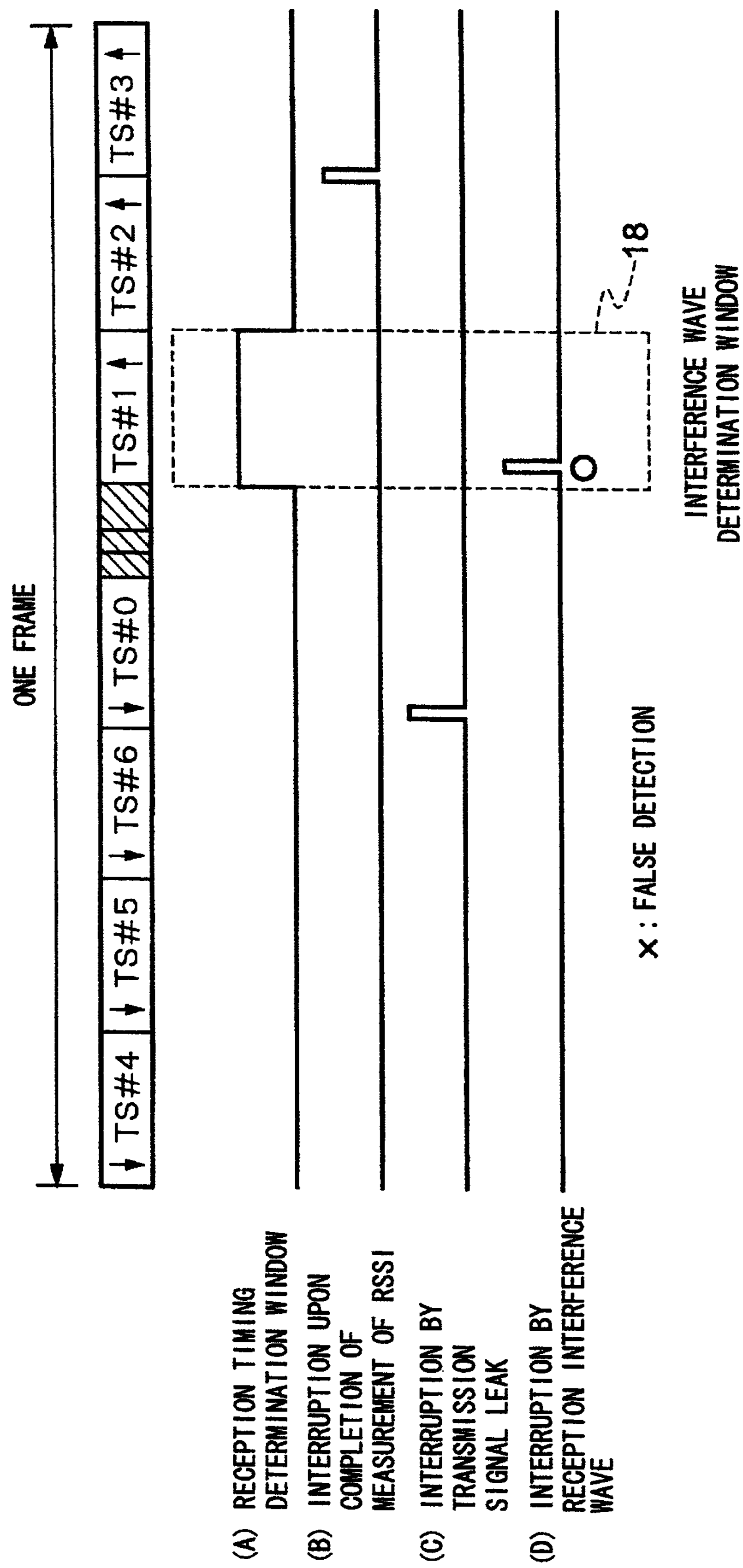
FIG. 3 is a timing chart showing an operation in the first exemplary embodiment of the time division duplex communication apparatus according to the present invention.

Next, with reference to the drawings, the configuration in the first exemplary embodiment of the time division duplex communication apparatus according to the present invention will be described in detail. FIG. 3 is a timing chart showing the operation in the first exemplary embodiment of the time division duplex communication apparatus according to the present invention. The transmitter 102 includes the D/A converter 1, the up-converter 2, the high-output power amplifier (hereinafter referred to as a PA) 3. The receiver 101 includes the LNA 5, the down converter 6, the variable ATT 7 for adjusting gain, and the DDC module 8.

The DDC module 8 includes the A/D converter 9 for converting analog signals to digital signals, the DDC unit 10 for cutting out signals digitalized by the A/D converter 9 by a digital filter for each carrier, and the interruption factor register 11 for notifying the CPU 13 of interruption occurred in each part.

When the value of the interruption factor register 11 is updated, the updated value is transmitted to the FPGA 12 in the control side. Upon receiving the notification of the occurrence of the interruption from the interruption factor register 11, the FPGA 12 first determines the timing at which the interruption has occurred (reception timing determination unit 21). When the timing is the reception timing, the reception timing determination unit 21 notifies the CPU 13 of the occurrence of the interruption, and determines whether the interruption is due to the overflow to store the result in the overflow interruption register 14.

The determination of the overflow is performed on the interruption occurred at the reception timing and the timing at which interruption other than that of the reception overflow cannot occur by an interference wave determination window 18 as shown in FIG. 3. The CPU 13 checks the overflow interruption register 14 in the FPGA 12 at the time of the occurrence of interruption from the FPGA 12 to determine whether there is overflow occurred by the interference wave. When the interruption is due to the interference wave, the CPU 13 controls the variable ATT 7 to clear the content of the interruption factor register 11. When the interruption is not due to the interference wave, the CPU 13 checks the value of the interruption factor register 11. When the interruption is due to the measurement of the received power, it performs measurement processing, and then clears the content of the interruption factor register.

FIG. 3 shows timings of interruption factors occurred in one frame. The reception timing determination unit 21 provides the window 18 for each interruption occurred in one frame, thereby accurately detecting target overflow.

Since TS#4 to #6 and TS#0 are transmission timings and the interruption (see FIG. 3(C)) of the DDC module 8 occurred at this timing occurs because of leakage power due to insufficient isolation between the transmitter and the receiver, it is ignored by the window 18.

TS#1 to #3 are reception timings. There are two kinds of interruptions occurred at these timings: overflow interruption (see FIG. 3(D)) that occurs when overflow (saturation) occurs beyond conversion capability of the A/D converter 9 by the interference wave, and the interruption (see FIG. 3(B)) to notify a higher-level apparatus of completion of the measurement of the received power (RSSI) when the measurement is completed.

The window 18 is required to be set to the width of TS#1 in order to distinguish the two kinds of interruptions. The reason is that the time slots TS#2 and TS#3 can be used for both of the transmission and the reception according to the communication setting, whereas TS#1 is a timing used only for the reception signal.

Since the power measurement is completed, the received power measurement interruption occurrence timing becomes the top of the next time slot of the time slot at the last of the reception. By providing a window that is capable of detecting only the interruption occurred at the timing of TS#1, the interruption due to the overflow by the interference wave and the interruption due to the completion of the measurement of the received power can be distinguished.

Figure 4:
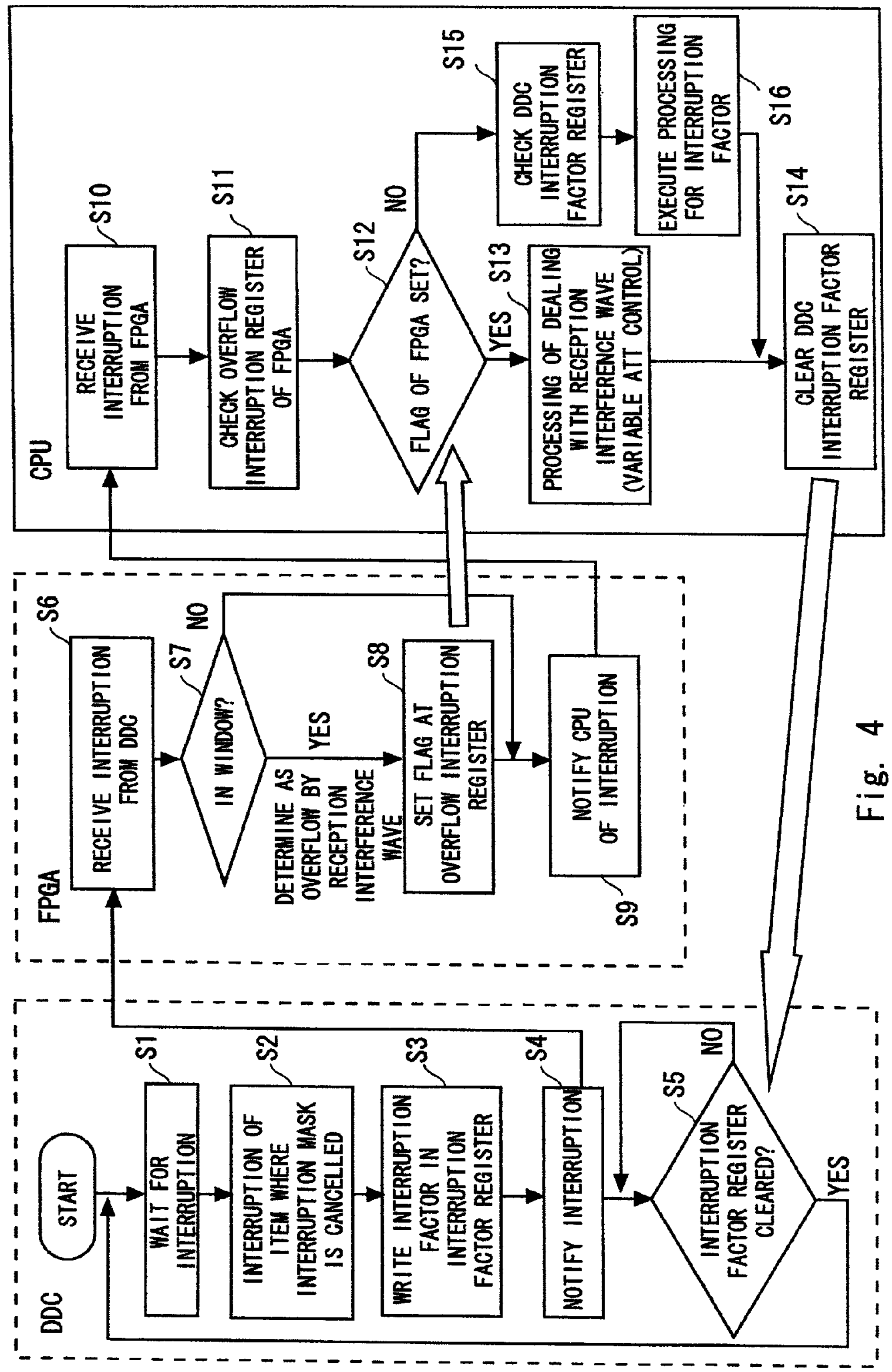
FIG. 4 is a flow chart showing an operation in the first exemplary embodiment of the time division duplex communication apparatus according to the present invention.

Hereinafter, with reference to FIGS. 2 to 3, and 4 to 6, an operation in the first exemplary embodiment of the time division duplex communication apparatus according to the present invention will be described. FIG. 4 is a flow chart showing the operation in the first exemplary embodiment of the time division duplex communication apparatus according to the present invention, FIGS. 5 to 7 are schematic diagrams each showing one example of a power relation between the interference wave and a received desired wave, and FIG. 8 is a timing chart showing one example of operations of the time division duplex communication apparatus according to the related art.

Figure 5:
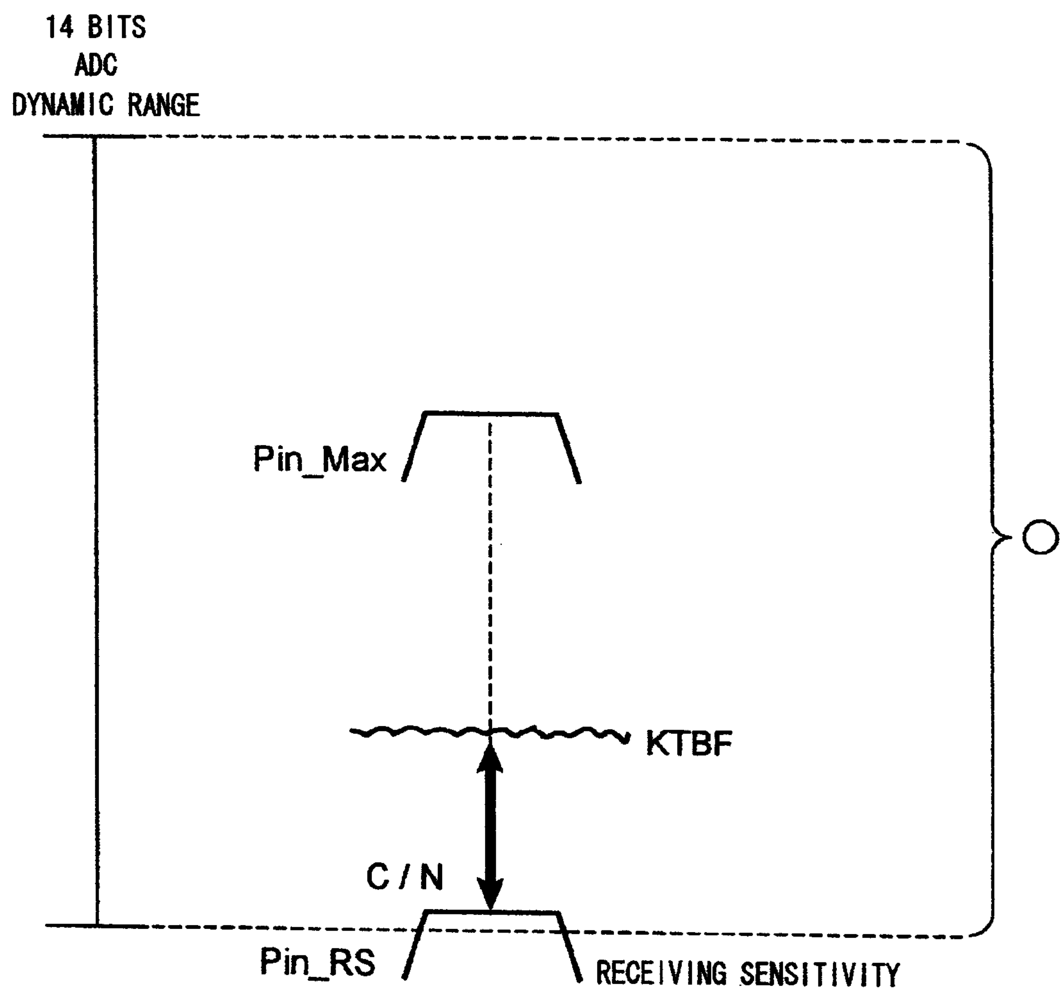
FIG. 5 is a schematic diagram showing one example of a power relation between an interference wave and a received desired wave.
Figure 6:
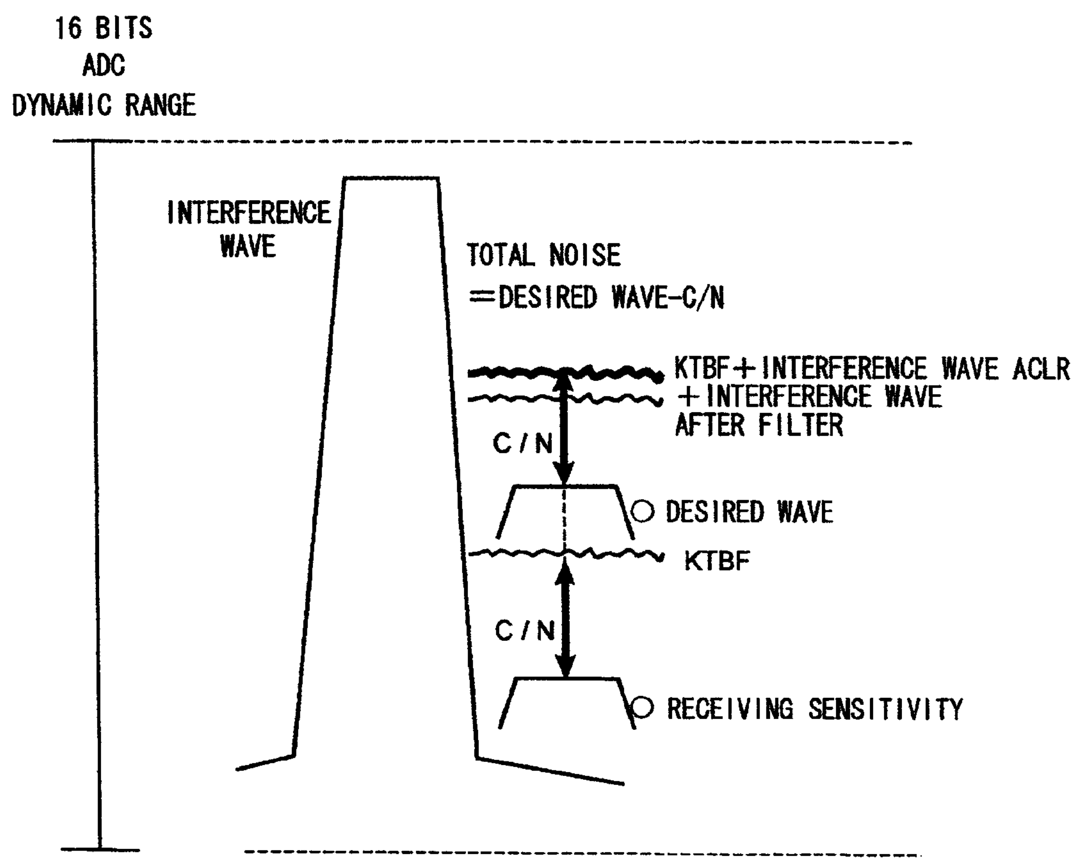
FIG. 6 is a schematic diagram showing one example of a power relation between an interference wave and a received desired wave.

When there is only a desired wave and no interference wave, the A/D converter 9 may have 14 bits as shown in FIG. 5. Since there occurs no degradation of sensitivity due to insufficiency of required C/N by the interference wave, a typical radio system is often sufficient with a dynamic range of 14 bits. When the interference wave is input with the maximum level specified by 3GPP (Third Generation Partnership Project) or the like, both of desired wave sensitivity when the interference wave is input and receiving sensitivity of lowest level may be normally satisfied if the resolution of the A/D converter 9 is 16 bits or more as shown in FIG. 6. However, since the A/D converter of 16 bits is expensive and there are only a few choices, a case in which a less expensive A/D converter of 14 bits is used is considered here.

Figure 7:
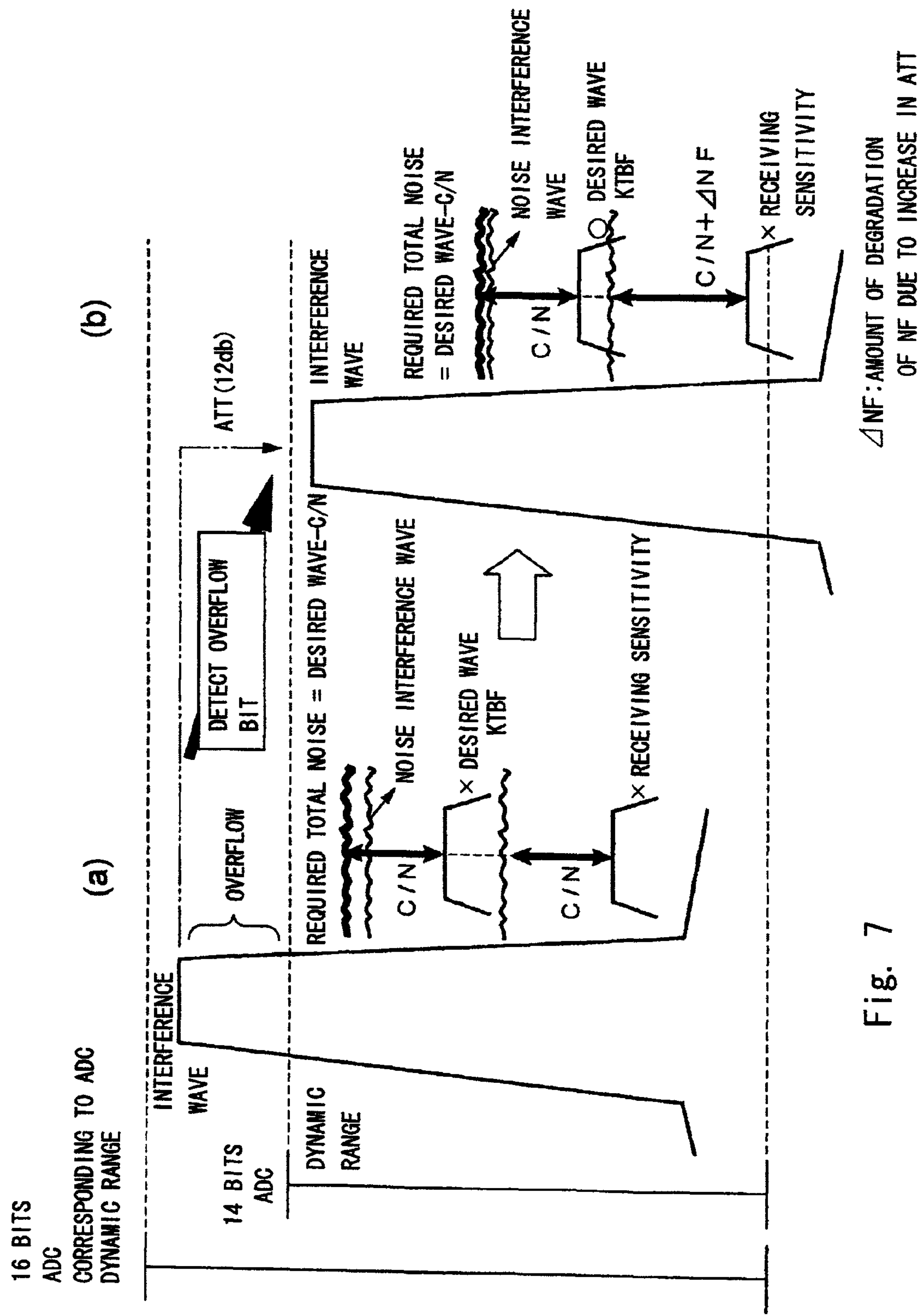
FIG. 7 is a schematic diagram showing one example of a power relation between an interference wave and a received desired wave.
Figure 8:
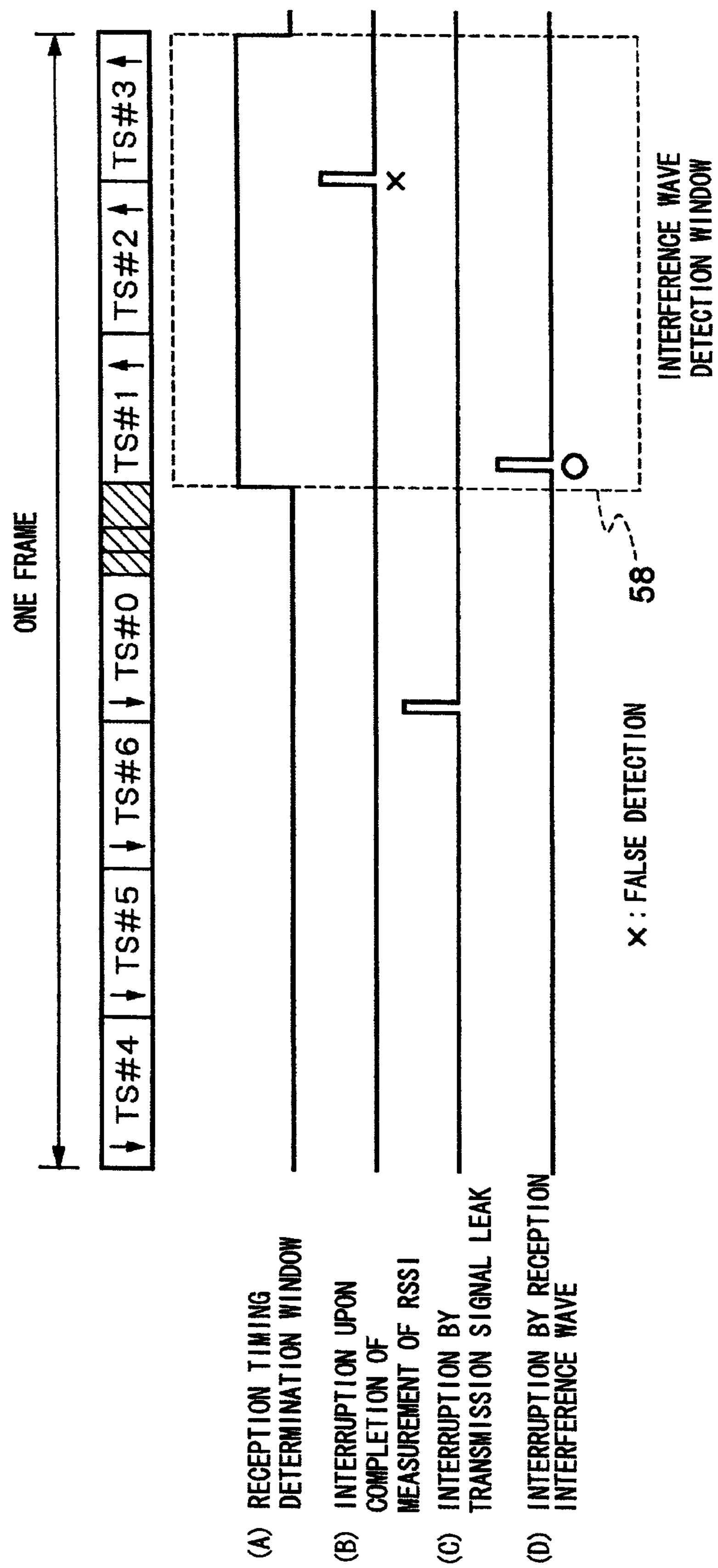
FIG. 8 is a timing chart showing an example of operations of a time division duplex transmitting/receiving apparatus in a related art.
Figure 9:
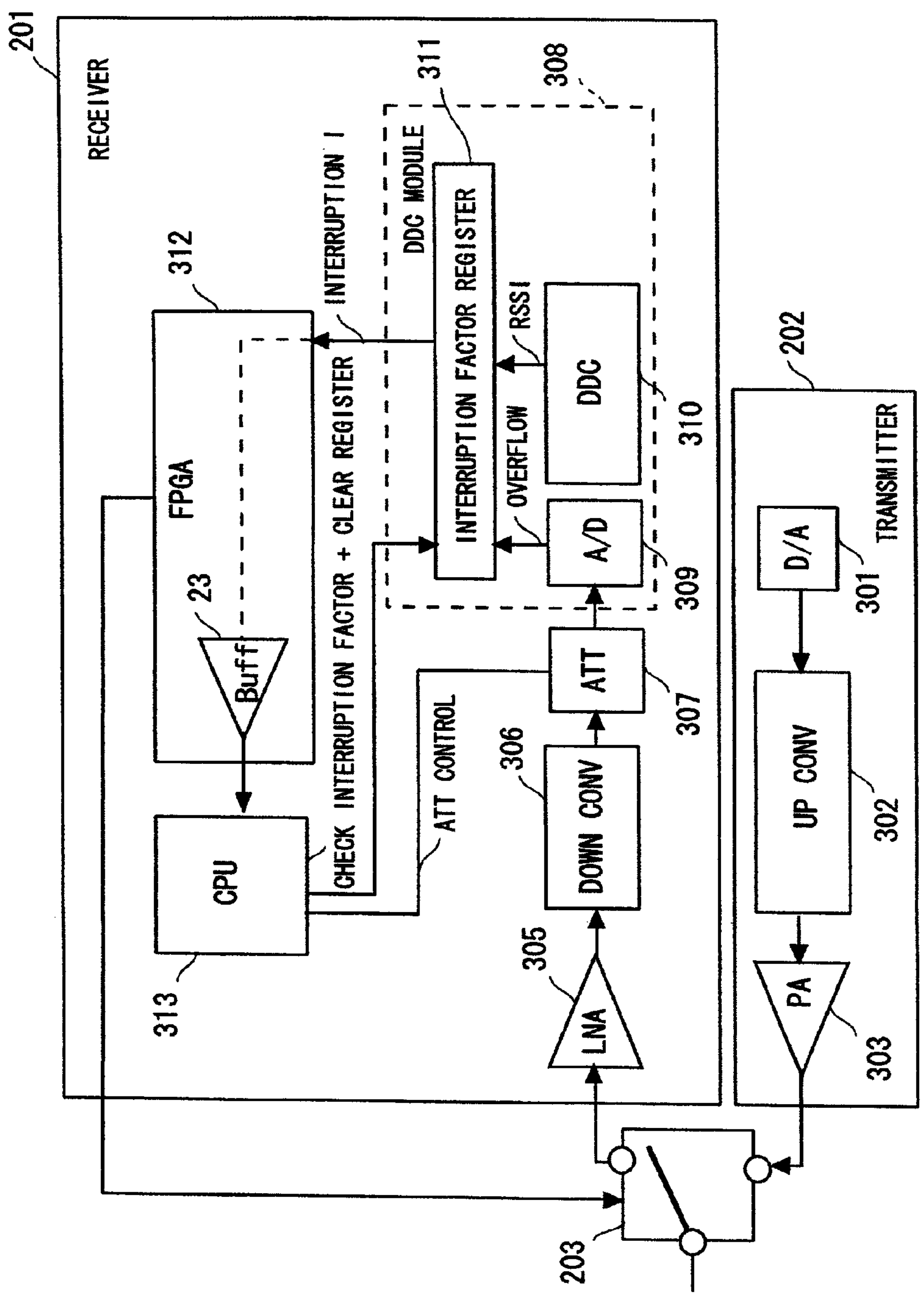
FIG. 9 is a configuration diagram of one example of a time division duplex communication apparatus related to the present invention.
Figure 10:
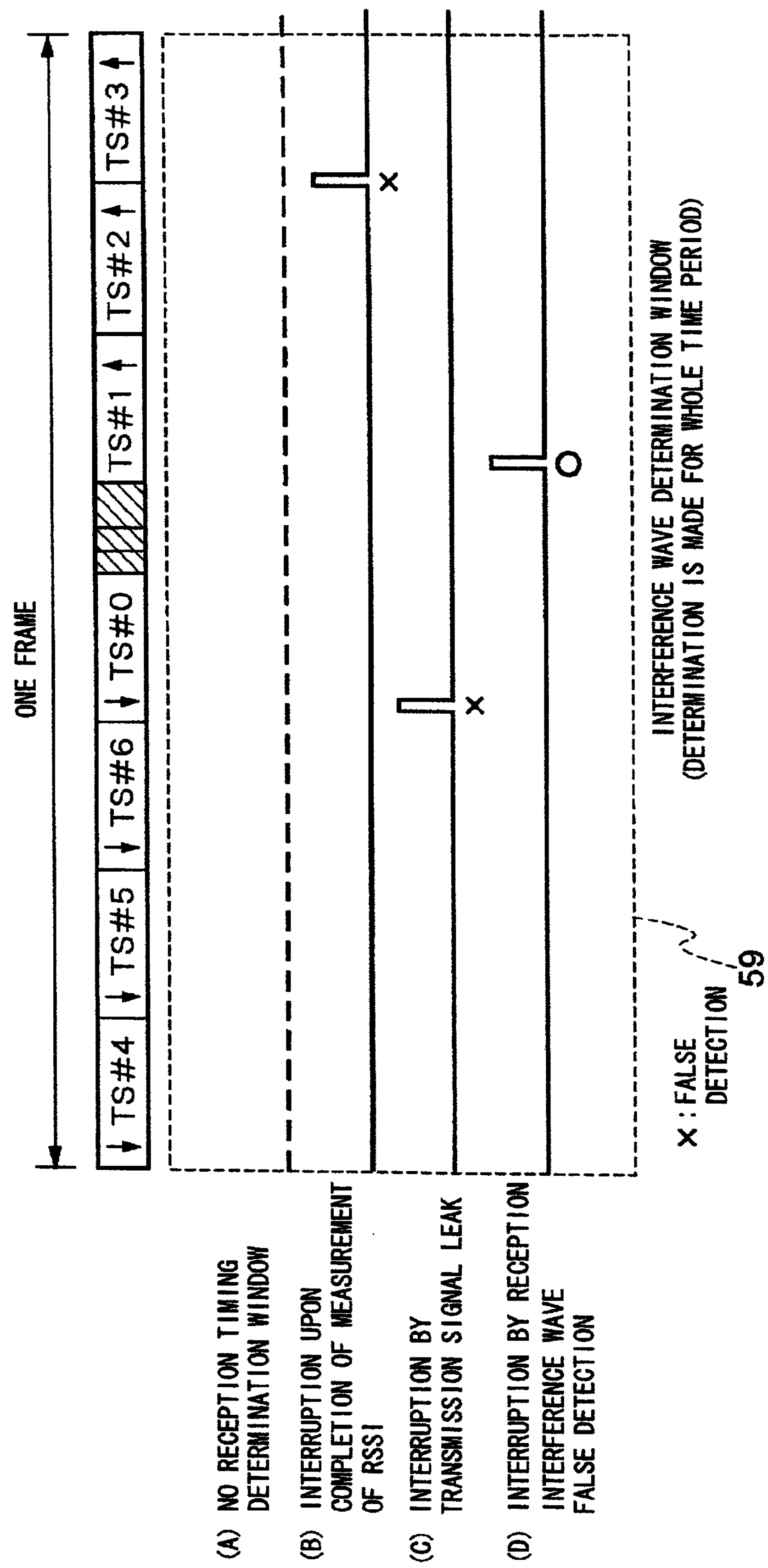
FIG. 10 is a timing chart showing one example of operations of the time division duplex communication apparatus related to the present invention.

When the interference wave that may overflow with the A/D converter 9 of 14 bits is input as shown in FIG. 7(*a*), the overflow of the A/D converter 9 can be prevented by increasing an attenuation amount of the variable ATT 7 upon detection that the A/D converter 9 has overflowed. As a result, the sensitivity of the desired wave can be maintained as shown in FIG. 7(*b*). When the interference wave is distinguished, the receiving sensitivity of minimum level can be secured by returning the variable ATT 7. Described first is a case in which this operation is achieved by the related art.

When the interference wave is input to an adjacent channel of the receiver, the A/D converter 9 overflows. Then the interruption is notified to the CPU 13 through the FPGA 12. Upon recognition of the interruption, the CPU 13 checks the interruption factor register 11. When the interruption factor is occurrence of interruption by overflow, the CPU 13 is capable of preventing the overflow of the A/D converter 9 by increasing the attenuation amount of the variable ATT 7 by a certain amount.

After keeping the state in which the attenuation amount of the variable ATT 7 is increased for a predetermined period of time, the variable ATT 7 is restored to the original value again. At this time, if the overflow occurs, the attenuation amount of the variable ATT 7 is increased again. If the overflow does not occur, it is determined that there is no interference wave any more or the interference wave level has sufficiently been reduced. In this case, the variable ATT 7 is restored to the original value to keep the receiving sensitivity. However, since the transmission and the reception are temporally divided in the apparatus of time division duplex system, normally the isolation between the transmitter and the receiver is not that large. Therefore, the leakage power of the signal output at the transmission timing goes around the A/D converter 9. Thus, the variable ATT 7 always exceeds a certain amount at the reception timing, which means the receiving sensitivity becomes insufficient.

Furthermore, it is difficult for the DDC module 8 to manage the timings other than the transmission/reception switch timing. It is assumed that the CPU 13 performs check of the interruption factor register 11 and the processing for the interruption factor within one frame after receiving the interruption notification. Therefore, the delay of one frame at maximum occurs also for the interruption due to the overflow caused by the interference wave.

Further, since the system is the time division duplex system, the timing to switch the transmission and the reception is always managed. Considered now is a method for preventing false determination of overflow by the leakage power of the transmission timing using this timing. Provided is an interference wave determination window 58 for enabling only the interruption occurred at the reception time by the transmission/reception switch timing (FIG. 8). Accordingly, it is possible to prevent false detection of overflow due to leakage power of the transmission timing.

However, the receiver normally performs measurement of the received power, and the interruption occurs to cause the receiver to perform power measurement anywhere at the reception timing. This interruption notification is not sufficient to determine whether the interruption is due to the measurement of the received power or the occurrence of overflow. Thus, the CPU 13 is required to check the interruption factor register 11. Accordingly, the process delay occurs as described above when the interruption is due to the overflow, which results in overflow for one frame at maximum.

The method to solve these problems according to the present invention will be described. When the value of the interruption factor register 11 is updated by the DDC module 8 (steps S1 to S3 in FIG. 4), the interruption notification that is common to the measurement of the received power and the overflow of the A/D converter 9 is transmitted to the FPGA 12 in the control side (steps S4 and S6).

Further, when the interruption factor register 11 is cleared ("YES" in step S5), the process goes back to step S1; when the interruption factor register 11 is not cleared ("No" in step S5), the process waits at step S5.

Upon receiving the notification of the occurrence of the interruption from the interruption factor register 11 (step S6), the FPGA 12 first determines the timing at which the interruption has occurred (reception timing determination unit 21) (step S7).

When the timing is the reception timing ("Yes" in step S7), the occurrence of the interruption is notified to the CPU 13, and it is determined whether the interruption is due to overflow. Then, the result is stored in the overflow interruption register 14 (see steps S8 and S9). On the other hand, when the timing is not the reception timing ("No" in step S7), the process jumps to step S9.

The determination of the overflow is performed on the interruption occurred at the reception timing and the timing at which interruption other than that of the reception overflow cannot occur by the interference wave determination window 18 as shown in FIG. 3. This timing is the time slot #1 (TS#1).

Upon occurrence of the interruption from the FPGA 12 (see step S10), the CPU 13 first checks the overflow interruption register 14 of the FPGA 12 (see step S11) to determine whether the interruption is due to the overflow by the interference wave or due to other factors (see step S12). Only when the cause of the interruption is the overflow by the interference wave ("Yes" in step S12), the CPU 13 controls the variable ATT 7 to prevent overflow of the A/D converter 9 (see step S13).

On the other hand, when the overflow interruption register 14 does not indicate the overflow ("No" in step S12), the interruption factor register 11 is checked (see step S15). When the interruption is due to the measurement of the received power, processing is performed. When the interruption is due to the overflow, it is neglected since it is the overflow at the transmission time period (see step S16). When the check is ended, the content stored in the interruption factor register 11 is cleared (see step S14).

FIG. 3 shows a timing for the interruption factor occurred in one frame. The target overflow can be accurately detected by providing the interference wave determination window 18 for each interruption occurred in one frame.

Since TS#4 to #6 and TS#0 are transmission timings, and the interruption of the DDC module 8 occurred at these timings occur because of the leakage power due to the insufficient isolation between the transmitter 102 and the receiver 101, it is ignored by the interference wave determination window 18.

TS#1 to #3 are reception timings. However, there are two kinds of interruptions occurred at these timings: overflow interruption which occurs when the A/D converter 9 overflows by the interference wave, and an interruption to notify a higher-level apparatus of completion of the measurement of the received power (RSSI: Receive Signal Strength Indicator).

In order to distinguish the two kinds of interruptions, the interference wave determination window 18 is required to be set to the width of TS#1. This is because, while the time slots TS#2 and TS#3 can be used for both of the transmission and the reception by the communication setting, TS#1 is the timing used only for the reception signal.

Since the power measurement is completed, the received power measurement interruption occurrence timing becomes the top of the next time slot of the time slot at the last of the reception. By providing the interference wave determination window 18 that is able to detect only the interruption that occurs at a timing of TS#1, it is possible to distinguish the interruption due to the overflow by the interference wave and the interruption due to the completion of the measurement of the received power.

As described above, the first exemplary embodiment of the present invention achieves the following advantageous effects.

The first advantageous effect is that the dynamic range can be secured with the A/D converter of low bit number. For example, the dynamic range of about 16 bits can be secured with the A/D converter of 14 bits.

The second advantageous effect is that an inexpensive ready-made digital down converter (DDC) can be used. This may reduce initial cost, design cost, and delivery schedule.

The third advantageous effect is that there is no need to care about the overflow of the A/D converter by the transmission output leakage of the transmission time in time division duplex communication, and there is no need to achieve extremely high isolation. The receiver may be achieved by an inexpensive configuration without requiring a switch of high isolation and a solid shield to secure sufficient isolation.

Next, a second exemplary embodiment will be described. The second exemplary embodiment relates to a program of a reception interference preventing method. As described above, the receiver 101 according to the present invention includes the main controller 14 and the program storing unit 15 (see FIG. 2). The program storing unit 15 stores the program of the reception interference preventing method shown in the flow chart in FIG. 4 described above. The main controller 14 ("computer") is configured to control each part of the DDC module 8, the FPGA 12, and the CPU 13.

The main controller 14 reads out the program of the reception interference preventing method from the program storing unit 15, and controls each part of the DDC module 8, the FPGA 12, and the CPU 13 according to the program. The detail of the control has already been described above; the description thereof will be omitted here.

As described above, according to the second exemplary embodiment of the present invention, it is possible to distinguish interruption by a received interference wave at the reception time, interruption upon completion of measurement of the received power at the reception time, and interruption by electric power leaked into the receiving system at the transmission time, thereby obtaining a program of a reception interference preventing method that is capable of preventing overflow of the A/D converter by gain adjustment with respect to the received interference wave.

Although the present invention has been described as a hardware configuration in the exemplary embodiments described above, the present invention is not limited to it. The present invention may achieve the processing shown in FIG. 4 by causing a CPU (Central Processing Unit) to execute a computer program.

The program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (programmable ROM), EPROM (Erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

While the present invention has been described with reference to the exemplary embodiments, the present invention is not limited to the description above. Various changes that can be understood by a person skilled in the art may be made to the configuration and the detail of the present invention within the scope of the present invention.

This application claims the benefit of priority, and incorporates herein by reference in its entirety, the following Japanese Patent Application No. 2009-207606 filed on Sep. 9, 2009.

REFERENCE SIGNS LIST

1 D/A CONVERTER
2 UP-CONVERTER

3 POWER AMPLIFIER (PA)
4 SWITCH
5 LOW NOISE AMPLIFIER (LNA)
6 DOWN CONVERTER
7 VARIABLE ATTENUATOR
8 DIGITAL DOWN CONVERTER (DDC) MODULE
9 A/D CONVERTER
10 DDC UNIT
11 INTERRUPTION FACTOR DETECTION UNIT (INTERRUPTION FACTOR REGISTER)
12 FPGA
13 CPU
14 MAIN CONTROLLER
15 PROGRAM STORING UNIT
18 INTERFERENCE WAVE DETERMINATION WINDOW
21 RECEPTION TIMING DETERMINATION UNIT
22 OVERFLOW INTERRUPTION REGISTER
31 INTERFERENCE WAVE DETERMINATION UNIT
32 PROCESSOR TO DDC
101 RECEIVER
102 TRANSMITTER

The invention claimed is:

1. A time division duplex communication apparatus comprising:

an adjustment unit that adjusts a power of a reception signal to a second power below an overflow threshold of an analog to digital converter;

an interruption detection unit that detects an interruption signal from the reception signal;

a determination unit that determines whether the interruption signal is due to a received interference wave by using a temporal window set to a time slot width dedicated for reception in a plurality of time slots used as a reception timing;

a register that stores the determination result by the determination unit; and a control unit that controls the adjustment unit when the determination result determines that the interruption signal is due to the received interference wave is stored in the register, wherein the determination unit determines that the interruption signal is caused by the received interference wave when the interruption signal is detected during a temporal window, wherein the temporal window begins after completion of a measurement of received power and ends before the start of the measurement of received power, and wherein the apparatus does not transmit one or more signals during the temporal window.

2. The time division duplex communication apparatus according to claim 1, wherein the adjustment unit comprises a variable attenuator for adjusting the power of the reception signal.

3. The time division duplex communication apparatus according to claim 2, further comprising:

the analog to digital converter that converts the reception signal from an analog signal to a digital signal; wherein the control unit controls an attenuation amount of the reception signal in the adjustment unit to prevent saturation of the analog to digital converter beyond a conversion capability by the received interference wave.

4. The time division duplex communication apparatus according to claim 3, wherein the analog to digital converter converts an analog signal output from the variable attenuator to a digital signal, and outputs the digital signal to the determination unit.

5. The time division duplex communication apparatus according to claim 3, wherein the determination unit determines that the interruption signal is caused by the received interference wave when the interruption signal is detected during a temporal window that detects the interruption signal due to the received interference wave.

6. The time division duplex communication apparatus according to claim 3, further comprising:

a transmission unit that transmits a transmission signal;

a reception unit that comprises the adjustment unit, the detection unit, the determination unit, and the control unit; and a switch unit that switches the transmission unit and the reception unit by time division duplex.

7. The time division duplex communication apparatus according to claim 2, wherein the analog to digital converter converts an analog signal output from the variable attenuator to a digital signal, and outputs the digital signal to the determination unit.

8. The time division duplex communication apparatus according to claim 7, wherein the determination unit determines that the interruption signal is caused by the received interference wave when the interruption signal is detected during a temporal window that detects the interruption signal due to the received interference wave.

9. The time division duplex communication apparatus according to claim 7, further comprising:

a transmission unit that transmits a transmission signal;

a reception unit that comprises the adjustment unit, the detection unit, the determination unit, and the control unit; and a switch unit that switches the transmission unit and the reception unit by time division duplex.

10. The time division duplex communication apparatus according to claim 2, wherein the determination unit determines that the interruption signal is caused by the received interference wave when the interruption signal is detected during a temporal window that detects the interruption signal due to the received interference wave.

11. The time division duplex communication apparatus according to claim 2, further comprising:

a transmission unit that transmits a transmission signal;

a reception unit that comprises the adjustment unit, the detection unit, the determination unit, and the control unit; and a switch unit that switches the transmission unit and the reception unit by time division duplex.

12. The time division duplex communication apparatus according to claim 1, further comprising:

a transmission unit that transmits a transmission signal;

a reception unit that comprises the adjustment unit, the detection unit, the determination unit, and the control unit; and a switch unit that switches the transmission unit and the reception unit by time division duplex.

13. The time division duplex communication apparatus according to claim 12, wherein the reception unit comprises a low noise amplifier for low-noise-amplifying the reception signal and a down converter for converting a frequency of the reception signal output from the low noise amplifier into a lower frequency to output the reception signal to the variable attenuator, and the transmission unit comprises a digital-analog converter for converting the transmission signal from a digital signal to an analog signal, an up-converter for converting a frequency of an output signal from the digital-analog converter into a higher frequency, and a power amplifier for amplifying power of an output signal from the up-converter.

14. A reception interference preventing method in a time division duplex communication comprising:

adjusting a power of a reception signal to a second power below an overflow threshold of an analog to digital converter;

detecting an interruption signal from the reception signal;

determining whether the interruption signal is due to a received interference wave by using a temporal window set to a time slot width dedicated for reception in a plurality of time slots used as a reception timing; and controlling power adjustment of the reception signal when a determination result determines that the interruption signal is the received interference wave is stored in a register, wherein it is determined that the interruption signal is caused by the received interference wave when the interruption signal is detected during the temporal window, wherein the temporal window begins after completion of a measurement of received power and ends before the start of the measurement of received power, and wherein no transmission of signals occurs during the temporal window.

15. The reception interference preventing method in the time division duplex communication according to claim 14, comprising:

converting the reception signal from an analog signal to a digital signal after the power of the reception signal is adjusted; and adjusting the power of the reception signal to prevent saturation beyond a conversion capability from the analog signal to the digital signal by the received interference wave when the power adjustment of the reception signal is controlled.

16. The reception interference preventing method in the time division duplex communication according to claim 14, comprising, when the reception signal is received, low-noise amplifying the reception signal; and converting a frequency of the reception signal that is low-noise amplified to a lower frequency, and when a transmission signal is transmitted, converting the transmission signal from the digital signal to the analog signal;

converting a frequency of the transmission signal converted to the analog signal to a higher frequency; and power-amplifying the transmission signal having converted frequency.

* * * * *